(12) United States Patent
Kaneki et al.

(10) Patent No.: US 10,739,514 B2
(45) Date of Patent: Aug. 11, 2020

(54) LIGHT SOURCE DEVICE, BACKLIGHT DEVICE COMPRISING THE SAME AND LIQUID CRYSTAL DISPLAY DEVICE

(71) Applicant: Japan Display Inc., Tokyo (JP)

(72) Inventors: Takeshi Kaneki, Tokyo (JP); Hiromichi Tanaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/040,645

(22) Filed: Jul. 20, 2018

(65) Prior Publication Data

US 2019/0025498 A1   Jan. 24, 2019

(30) Foreign Application Priority Data

Jul. 21, 2017 (JP) ................. 2017-142239

(51) Int. Cl.
*F21V 8/00* (2006.01)
*G02F 1/13357* (2006.01)

(52) U.S. Cl.
CPC ........... *G02B 6/0083* (2013.01); *G02B 6/009* (2013.01); *G02F 1/133615* (2013.01); *H05K 2201/10106* (2013.01)

(58) Field of Classification Search
CPC .... G02B 6/0083; G02B 6/009; G02B 6/0011; G02B 6/0013; G02B 6/0015; G02B 6/0016; G02B 6/0018; G02B 6/002; G02B 6/0021; G02B 6/0023; G02B 6/0025; G02B 6/0026; G02B 6/0028; G02B 6/003; G02B 6/0031; G02B 6/0088; H05K 1/181; H05K 2201/10522; H05K 2201/10106; G02F 1/133615; G02F 1/133308; G02F 1/133608; G02F 2001/133311; G02F 2001/133314; G02F 2001/133317; G02F 2001/13332; G02F 2001/133322; G02F 2001/133325; G02F 2001/133328; G02F 2001/133331; G02F 2001/133334; G02F 1/0121; G02F 1/0327; G02F 1/076; G02F 1/133; G02F 1/13306; G02F 1/1345; G02F 1/13452; G02F 1/13454; G02F 1/13458; G02F 2001/133388; G02F 2001/133612; G02F 2001/13456; G09G 2300/0426; G09G 2300/0408; G09G 3/3655; G09G 3/3674; G09G 3/3685; G09G 2290/00; G09G 2320/0223; G09G 2300/0421; G09G 3/36; H01L 23/48; H01L 23/49572;
(Continued)

(56) References Cited

U.S. PATENT DOCUMENTS

2008/0037285 A1* 2/2008 Eda ..................... G02B 6/0083
362/631
2008/0043171 A1* 2/2008 Takahashi ............ G02B 6/0083
349/65
(Continued)

FOREIGN PATENT DOCUMENTS

JP   2015-176680 A   10/2015
JP   2016-207279 A   12/2016

*Primary Examiner* — Shan Liu
(74) *Attorney, Agent, or Firm* — K&L Gates LLP

(57) ABSTRACT

According to one embodiment, a light source device includes a wiring substrate including a mount region, a plurality of light sources arranged and mounted on the mount region of the wiring substrate, and a heat reactive adhesive sheet adhered to the wiring substrate.

9 Claims, 12 Drawing Sheets

(58) Field of Classification Search
CPC .............. H01L 2224/50; H01L 2224/79; H01L 2224/86; H01L 2225/06579; H01L 2225/107; H01L 24/50
USPC ................................ 349/65, 58–60, 149–152
See application file for complete search history.

(56) References Cited

U.S. PATENT DOCUMENTS

| | | | |
|---|---|---|---|
| 2010/0141865 A1* | 6/2010 | Jung | G02B 6/0091 349/61 |
| 2011/0058121 A1* | 3/2011 | Yabe | G02B 6/002 349/62 |
| 2011/0149203 A1* | 6/2011 | Kim | G02B 6/002 349/62 |
| 2013/0099344 A1* | 4/2013 | Ishii | G01T 1/2018 257/432 |
| 2013/0258247 A1* | 10/2013 | Tang | G02B 6/0023 349/65 |
| 2015/0124197 A1* | 5/2015 | Yeom | G02B 6/0091 349/65 |
| 2015/0260909 A1 | 9/2015 | Nambu et al. | |
| 2015/0280075 A1* | 10/2015 | Chang | H01L 33/44 257/88 |
| 2016/0016395 A1* | 1/2016 | Bushnell | B32B 37/1207 156/73.1 |
| 2016/0077270 A1* | 3/2016 | Komano | G02B 6/0028 349/65 |
| 2016/0306092 A1 | 10/2016 | Yoshida | |
| 2016/0313487 A1* | 10/2016 | Wang | G02B 6/009 |
| 2018/0203483 A1* | 7/2018 | Kwak | G06F 1/1637 |

\* cited by examiner

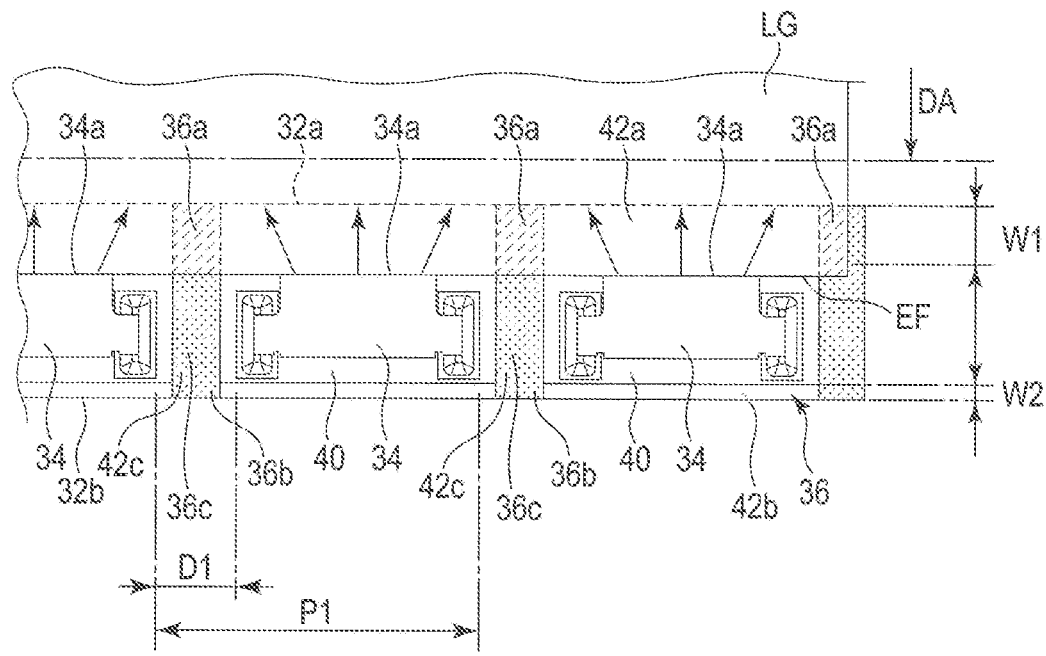
F I G. 9
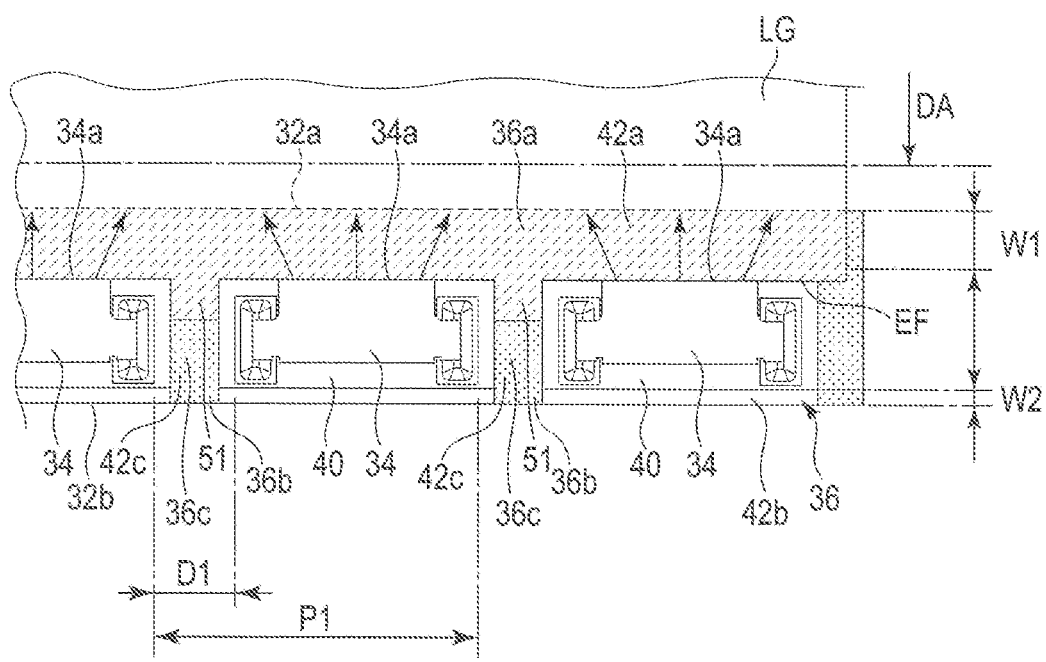
F I G. 10

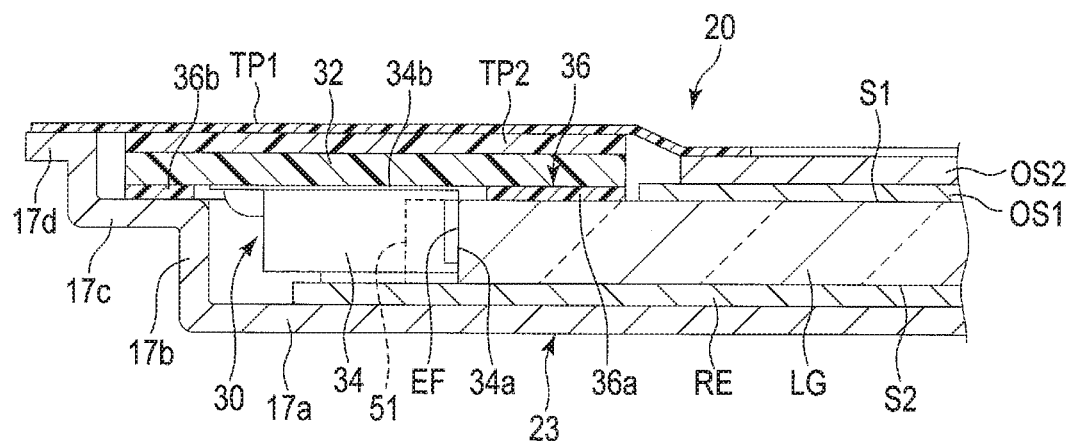
F I G. 15
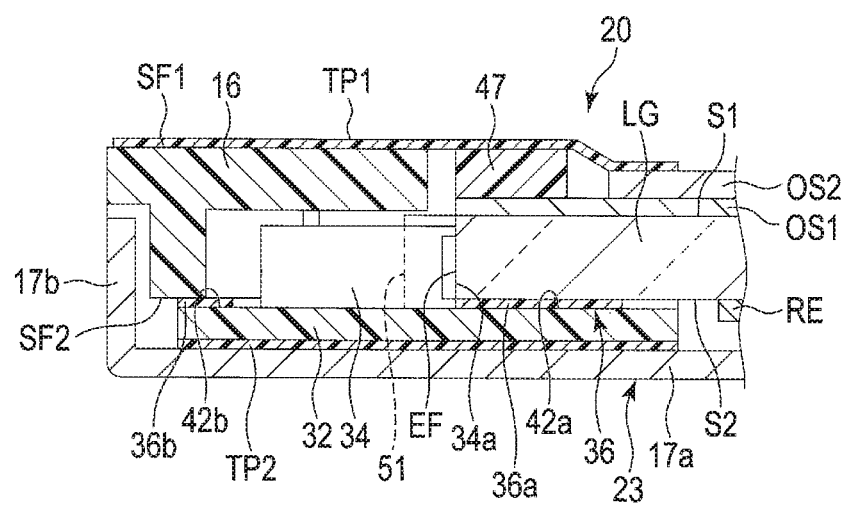
F I G. 16

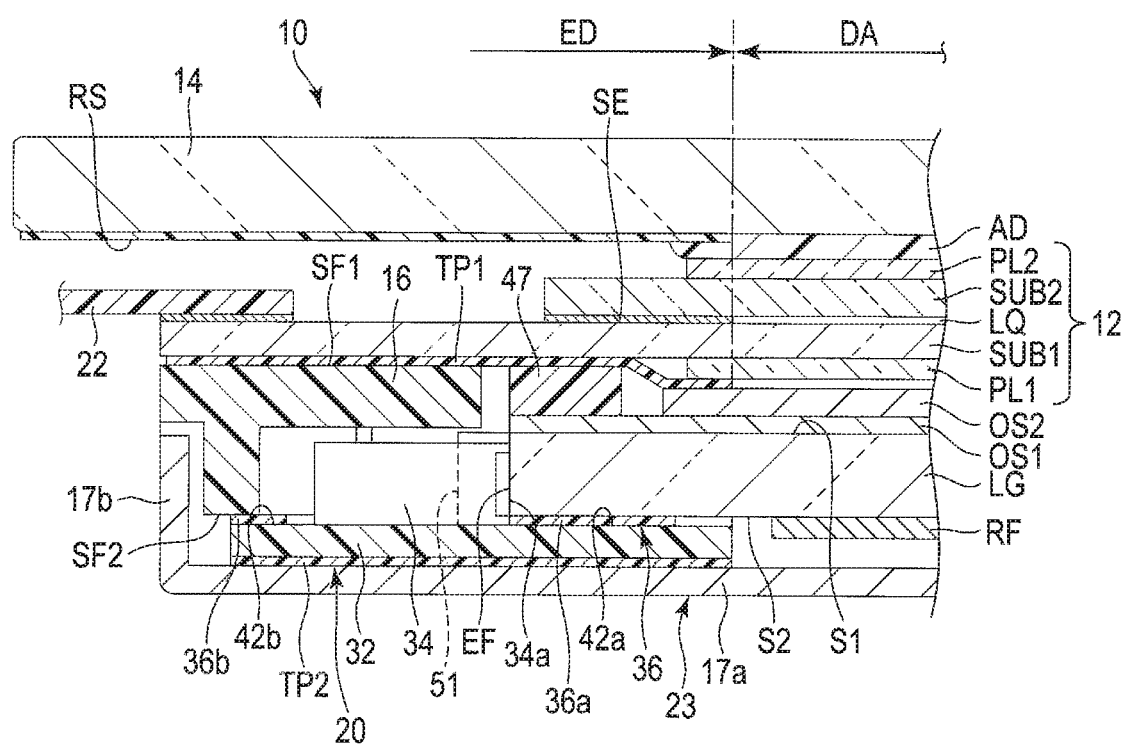
F I G. 17

LIGHT SOURCE DEVICE, BACKLIGHT DEVICE COMPRISING THE SAME AND LIQUID CRYSTAL DISPLAY DEVICE

CROSS-REFERENCE TO RELATED APPLICATIONS

This application is based upon and claims the benefit of priority from Japanese Patent Application No. 2017-142239, filed Jul. 21, 2017 and based upon Japanese Patent Application No. 2018-102530, filed May 29, 2018, the entire contents of all of which are incorporated herein by reference.

FIELD

Embodiments described herein relate generally to a light source device, a backlight device comprising the same, and a liquid crystal display device.

BACKGROUND

In recent years, liquid crystal display devices are widely used as a display device of smartphones, tablet computers, vehicle-navigation systems, etc. Generally, liquid crystal display devices comprise a liquid crystal panel and a backlight device overlaid on a rear surface of the liquid crystal panel to illuminate the liquid crystal panel. The backlight device comprises a frame (or bezel), a reflective layer, a light guide plate (light guide), an optical sheet (a prism sheet or diffusion sheet), a light source device (light source unit) which apply light incident on the light guide. The light source device includes a wiring substrate such as an FPC and a plurality of light sources (for example light-emitting diodes or LEDs) mounted on the wiring substrate. Such a light source device is held in a predetermined position, for example, by attaching the wiring board to the light guide and the frame with a double-sided tape as an adhesive material.

Conventionally, the width of the frame of a liquid crystal display device is reduced mainly by narrowing the frame on right and left sides thereof. However, in recent years, there is an increasing demand of greatly narrowing the frame on the light source side (light-entering side), which is the widest part of the frame. In order to narrow the frame on the light-entering side, it is necessary to decrease the distance from the light sources (LEDs) to the display area. However, if the distance is shortened, the difference in luminance between a bright portion at where a light source is provided and dark portion where it is not becomes prominent (non-uniformity in luminance). In order to reduce non-uniformity in luminance, it is necessary to reduce the intervals between light sources in the arrangement.

When the distance between a light source and the display area is reduced and further, the intervals between the light sources are reduced, the adhesion area of the double-sided tape which fixes the wiring board to the light guide plate or frame is decreased, making it difficult to assure sufficient adhesion area to maintain the adhesion strength. As a result, the adhesion between the wiring board and light guide may become incomplete, causing such drawbacks that non-uniformity in luminance occurs and the double-sided tape peels off during a drop test, making it difficult to achieve the narrower frame.

SUMMARY

The present application relates generally to a light source device, a backlight device comprising the same, and a liquid crystal display device.

According to an embodiment, a light source device is provided and includes a wiring substrate including a mount region; a plurality of light sources mounted on the mount region of the wiring substrate; and a heat reactive adhesive sheet adhered to the wiring substrate.

According to another embodiment, a backlight device is provided and includes a light guide comprising an emission surface and an incidence surface crossing the emission surface; and
a light source device configured to emit light entering the incidence surface, the light source device comprising a wiring substrate including a mount region, a plurality of light sources mounted on the mount region, and a heat reactive adhesive sheet adhered to the wiring substrate.

According to yet another embodiment, a liquid crystal display device is provided and includes a liquid crystal panel; and a backlight device provided to oppose the liquid crystal panel; the backlight device including a light guide comprising an emission surface and an incidence surface crossing the emission surface; and a light source device configured to emit light entering the incidence surface, the light source device comprising a wiring substrate including a mount region, a plurality of light sources mounted on the mount region of the wiring substrate and a heat reactive adhesive sheet adhered to the wiring substrate.

BRIEF DESCRIPTION OF THE DRAWINGS

FIG. 9 is a plan view of a light source unit according to a second modification, as viewed from the light guide plate side.

FIG. 10 is a plan view of a light source unit according to a third modification, as viewed from the light guide plate side.

FIG. 15 is a cross sectional view showing a light source-side portion of a backlight device of a liquid crystal display device according to a third embodiment.

FIG. 16 is a cross sectional view showing a light source-side portion of a backlight device of a liquid crystal display device according to a fourth embodiment.

FIG. 17 is a cross sectional view showing a light source-side portion of a liquid crystal display device according to a fifth embodiment.

DETAILED DESCRIPTION

Figure 1:
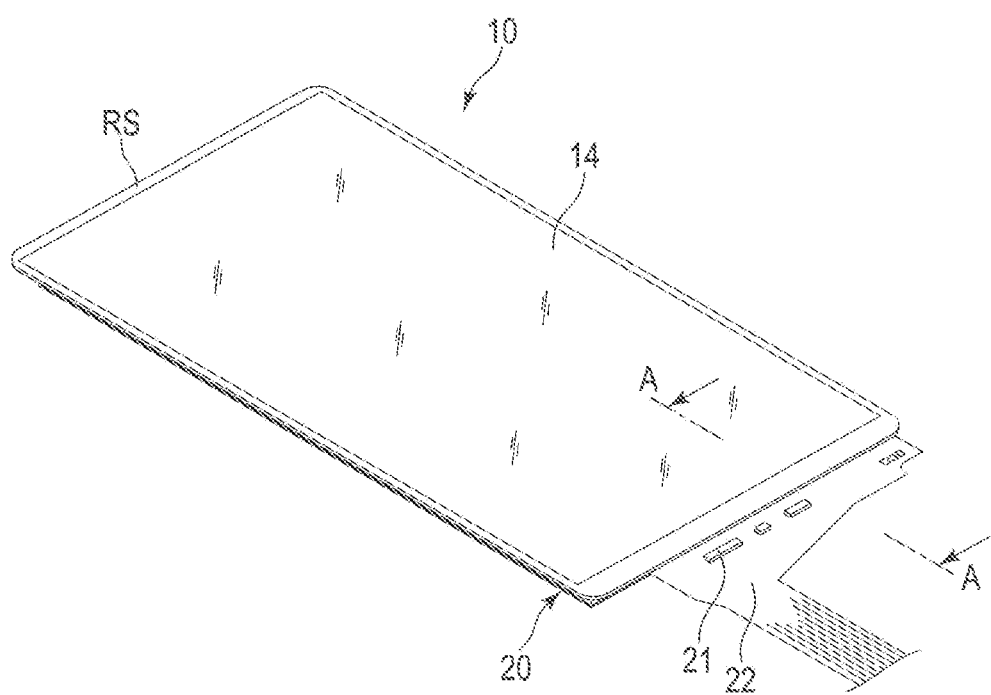
FIG. 1 is a perspective view showing a liquid crystal display device of a first embodiment from a display surface side.

Various embodiments will be described hereinafter with reference to the accompanying drawings. In general, according to one embodiment, a light source device comprises a wiring substrate including a mount region, a plurality of light sources arranged and mounted on the mount region of the wiring substrate, and a heat reactive adhesive sheet adhered to the wiring substrate.

The disclosure is merely an example, and proper changes in keeping with the spirit of the invention, which are easily conceivable by a person with ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Figure 2:
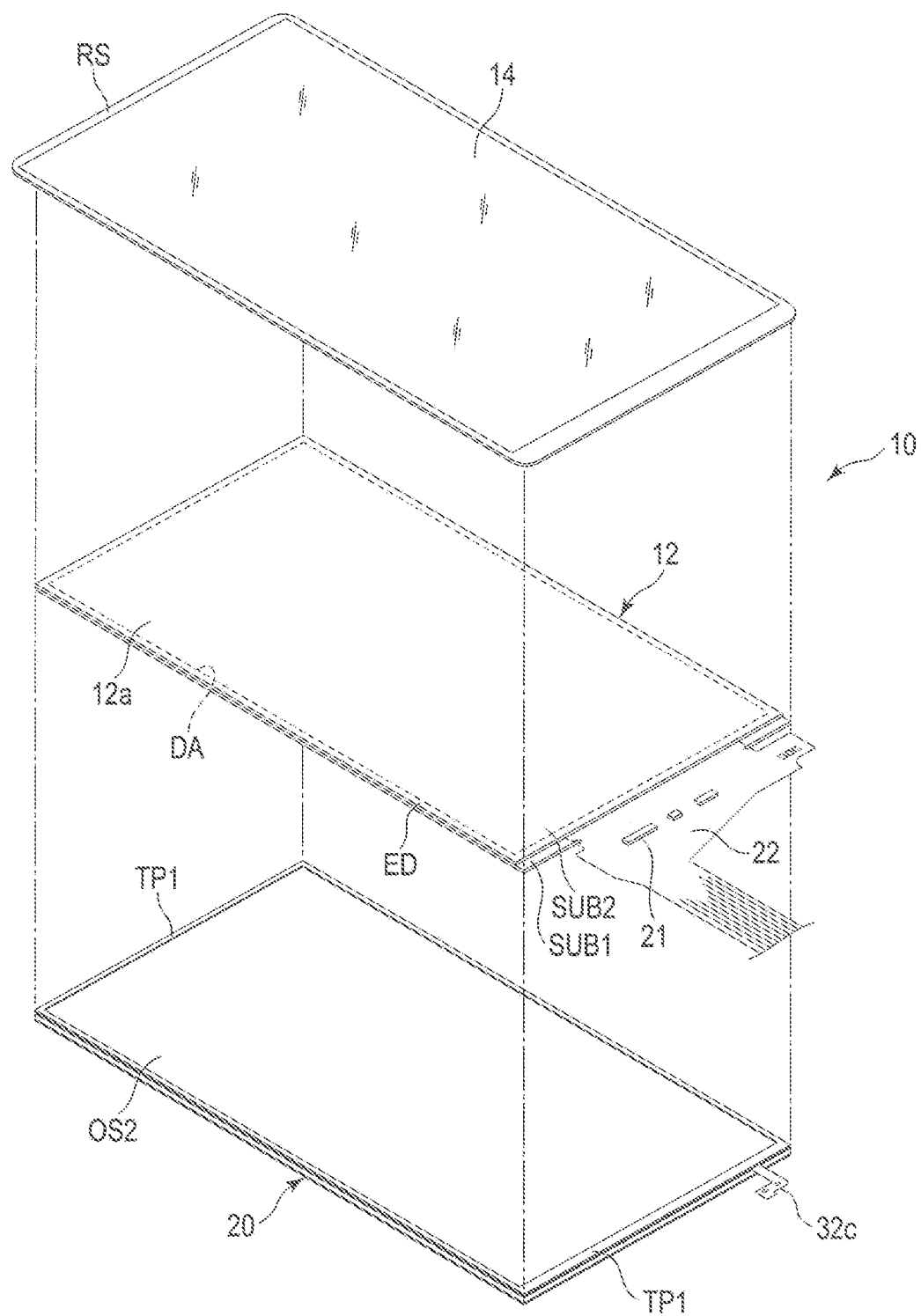
FIG. 2 is an exploded perspective view of the liquid crystal display device.

FIG. 1 is a perspective view of a display surface side of a liquid crystal display device according to the first embodiment, and FIG. 2 is an exploded perspective view of the liquid crystal display device.

A liquid crystal display device 10 can be incorporated into various electronic devices, for example, a smartphone, a tablet computer, a feature phone, a notebook computer, a portable game console, an electronic dictionary, a television set, and a satellite navigation system.

As shown in FIGS. 1 and 2, a liquid crystal display device 10 comprises an active-matrix type liquid crystal display panel (liquid crystal panel) 12, a cover panel 14 overlaid on a display surface 12a, which is one surface of the liquid crystal panel 12, to cover the entire display surface 12a, and a backlight unit (backlight device) 20 disposed to oppose a rear surface, which is another surface of the liquid crystal panel 12.

Figure 4:
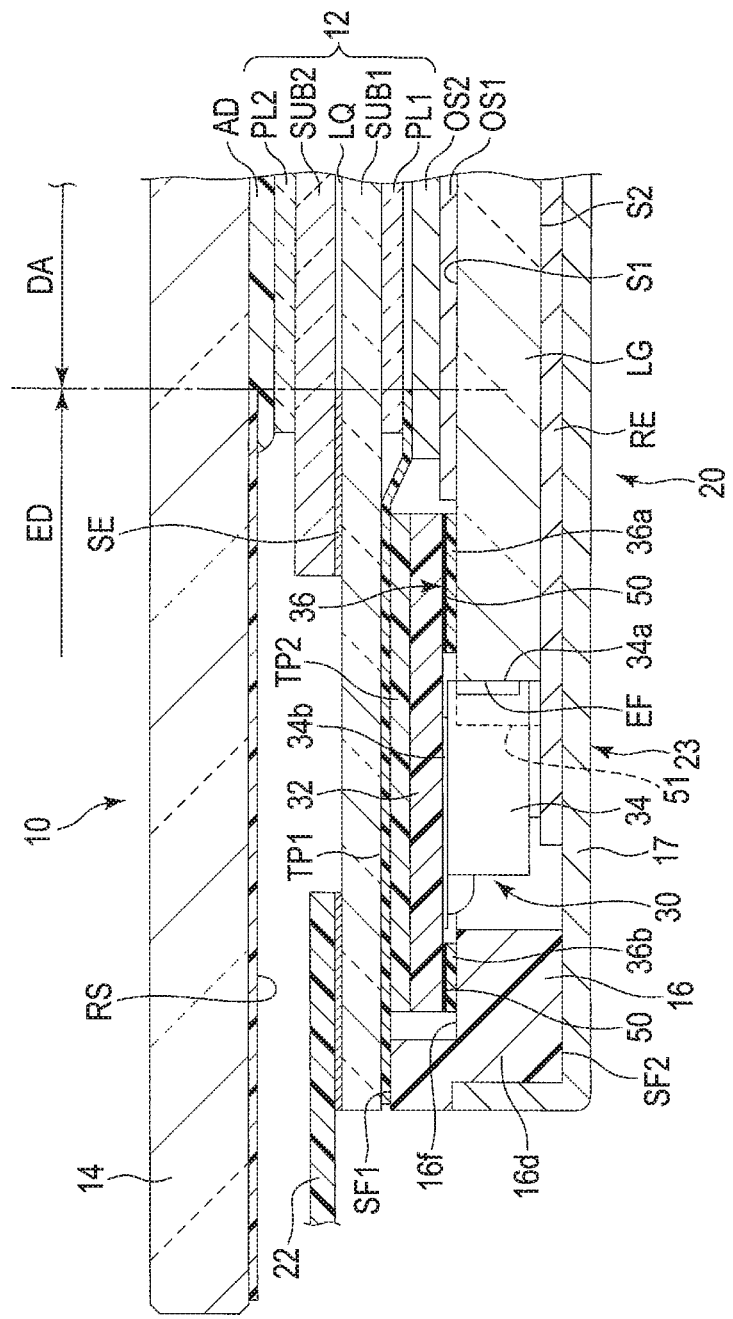
FIG. 4 is a cross sectional view showing a light source-side portion of the liquid crystal display device taken along line A-A of FIG. 1.

FIG. 4 is a cross sectional view showing a light source-side section of the liquid crystal display device taken along line A-A of FIG. 1. As shown in FIGS. 2 and 4, the liquid crystal panel 12 includes a rectangular first substrate SUB1, a rectangular second substrate SUB2 opposed to the first substrate SUB1, and a liquid crystal layer LQ held between the first substrate SUB1 and the second substrate SUB2. Each of the first substrate SUB1 and the second substrate SUB2 is formed of a transparent insulating substrate such as a glass plate or resin plate. A peripheral portion of the second substrate SUB2 is adhered to the first substrate SUB1 with a sealing member SE. On a surface of the second substrate SUB2, a polarizer PL2 is attached to form the display surface 12a of the liquid crystal panel 12. A polarizer PL1 is attached on a surface (a rear surface of the liquid crystal panel 12) of the first substrate SUB1.

In the liquid crystal panel 12, a rectangular display area (active area) DA is provided in an inner-side region of the sealing material SE in a certain state where the display surface 12a is viewed in plan view (which is the state where the liquid crystal panel is monitored from the normal direction of the surface of the liquid crystal panel, hereinafter). Images are displayed in the display area DA. A rectangular frame area (non-display area) ED is provided around the display area DA. The liquid crystal panel 12 has a transmissive display function of displaying images by selectively transmitting light emitted from the backlight unit 20.

In the example illustrated, a flexible printed circuit board (FPC) 22 is joined to a short-side end of the first substrate SUB1 and extends outward from the liquid crystal panel 12. A semiconductor element such as a driver IC chip 21 is mounted on the FPC 22 as a signal supply source which supplies a signal necessary for driving the liquid crystal panel 12.

As shown in FIGS. 1, 2 and 4, the cover panel 14 is formed, for example, from a glass board or an acrylic transparent resin into a rectangular plate shape. The cover panel 14 covers the entire display surface 12a of the liquid crystal panel 12. A frame-shaped light-shielding layer RS is formed in a peripheral portion of the rear surface (which is on a liquid crystal panel 12 side or opposite to the surface facing the observer) of the cover panel 14. The light-shielding layer RS may be formed on an upper surface (display surface) of the cover panel 14.

The rear surface (back) of the cover panel 14 is attached to a polarizer PL2 of the liquid crystal panel 12 with a light-transmissive adhesive or tackiness agent, for example, an adhesive sheet AD of an optical light transparent resin.

Figure 3:
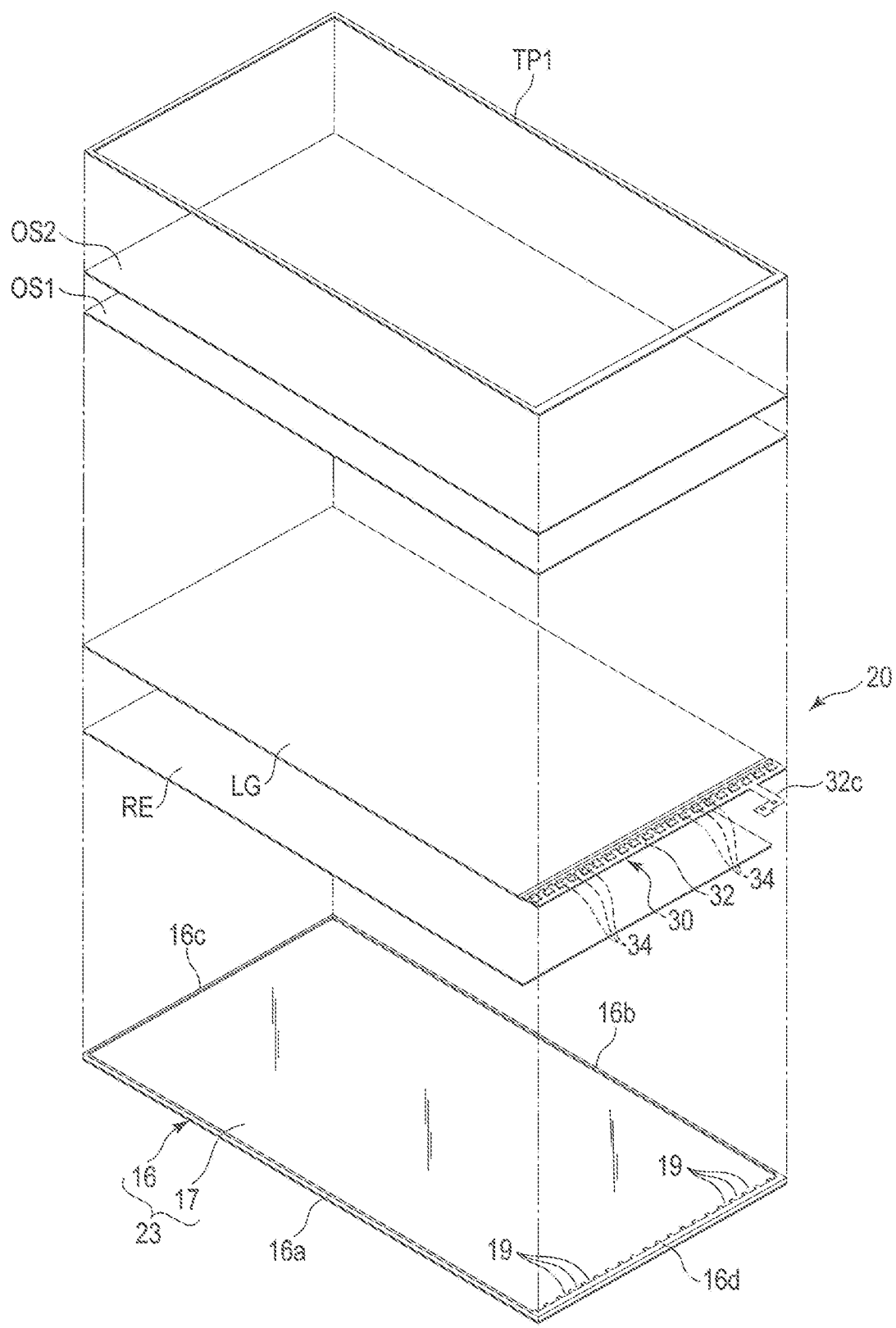
FIG. 3 is an exploded perspective view of a backlight unit of the liquid crystal display device.

FIG. 3 is an exploded perspective view of the backlight unit 20. As shown in FIGS. 2, 3 and 4, the backlight unit 20 comprises a case 23, a plurality of optical members disposed in the case 23 and a light source unit 30 which supplies light to be incident on the optical members. In this embodiment, the case 23 comprises a rectangular frame 16 and a rectangular bottom plate 17 fixed to the frame 16. The frame 16 and the bottom plate 17 may be formed integrally as one body from a resin or metal. Similarly, such a structure that one is formed of resin and the other is of metal is also adoptable.

The frame 16 comprises a pair of long side portions 16a and 16b opposing each other and a pair of short side portions 16c and 16d opposing each other. The frame 16 comprises a stepped portion 16f formed therein at a one step lower level from the upper surface. The level difference (depth) of the stepped portion 16f is approximately the same as a total thickness of two optical sheets OS1 and OS2, which will be described later. A plurality of recesses 19 are formed in an inner edge of the short side portion 16d located on a light source side.

The peripheral portion of the bottom plate 17 is fixed to a second surface SF2 and an outer surface of the frame 16.

The optical members of the backlight unit 20 include a reflective sheet RE arranged on the bottom plate 17 within the frame 16, a light guide LG and a plurality of, for example, two sheets, a first optical sheet OS1 and a second optical sheet OS2 overlaid on the light guide LG.

The reflective sheet RE is formed into a rectangular shape in plan view, dimensions of which are slightly smaller than inner dimensions of the frame 16. The reflective sheet RE is overlaid on the bottom plate 17 to cover substantially the entire surface of the bottom plate 17.

The light guide LG is formed of a light-transmissive resin such as of acrylic or a silicon-based, into a parallelepiped shape. The light guide LG comprises a first main surface S1 serving as an emission surface, a second main surface S2 on an opposite side to the first main surface S1, and a plurality of side surfaces. In this embodiment, one short-side surface of the light guide LG is an incidence surface EF.

The light guide LG is disposed in the frame 16 and is overlaid on the reflective sheet RE in the state where a second main surface S2 opposes the reflective sheet RE. The incidence surface EF opposes the short side portion 16d of the frames 16 with a gap therebetween.

According to this embodiment, as the first optical sheet OS1 and second optical sheet OS2, for example, a light transmissive diffusion sheet or prism sheet formed of a synthetic resin such as polyethylene terephthalate is employed. The optical sheets OS1 and OS2 are overlaid in this order on the first main surface S1 of the light guide LG. At least three side edge portions excluding one on the light source side of the optical sheets OS1 and OS2 are placed on the stepped portion 16f of the frame 16.

The number of optical sheets is not limited to two and may be three or more or may be one.

Figure 5:
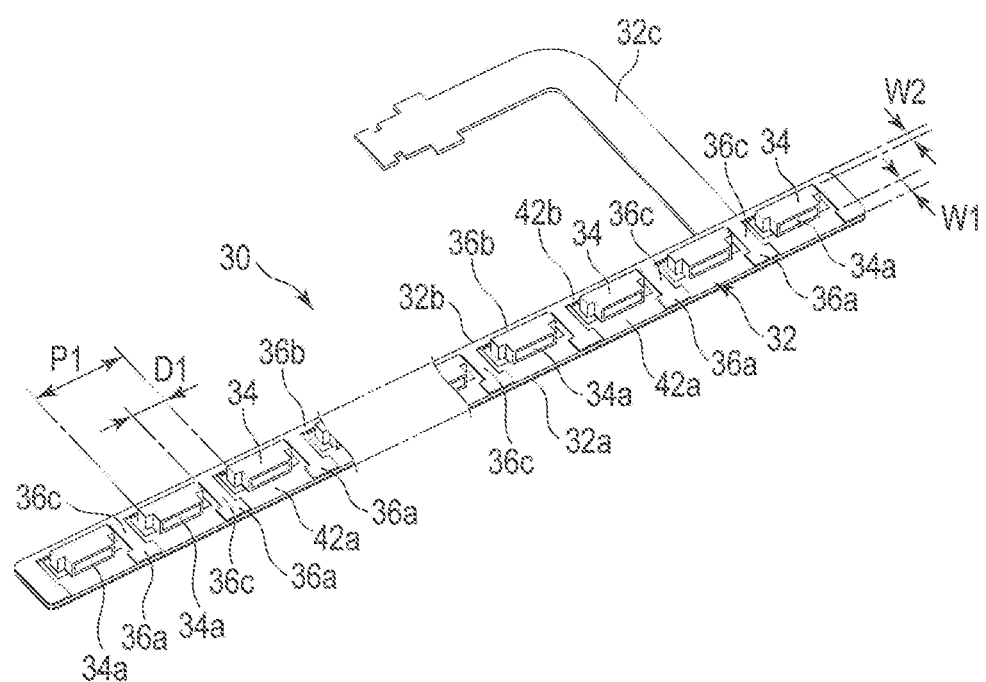
FIG. 5 is a perspective view showing a light source unit of the backlight unit.
Figure 6:
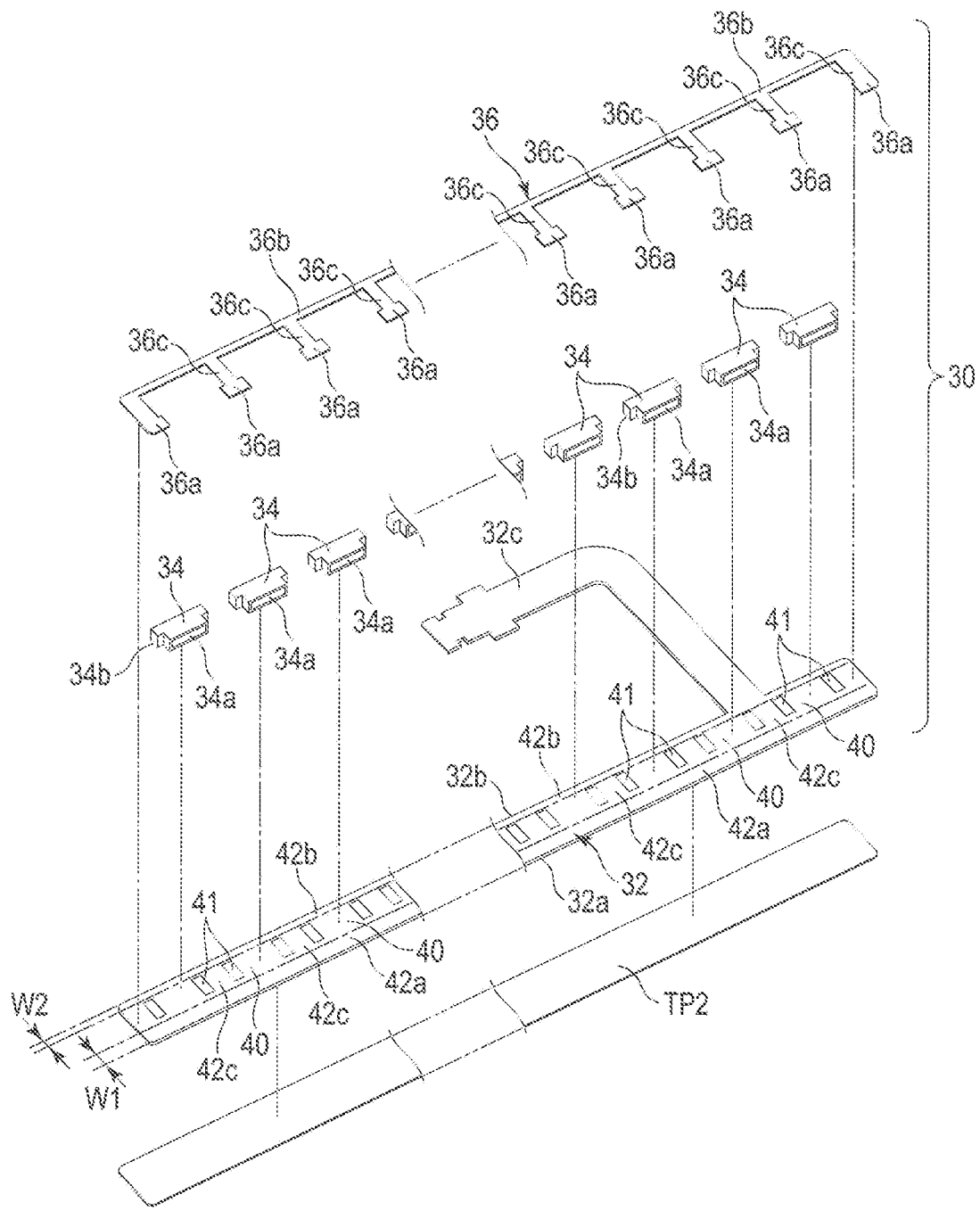
FIG. 6 is an exploded perspective view of the light source unit.
Figure 7:
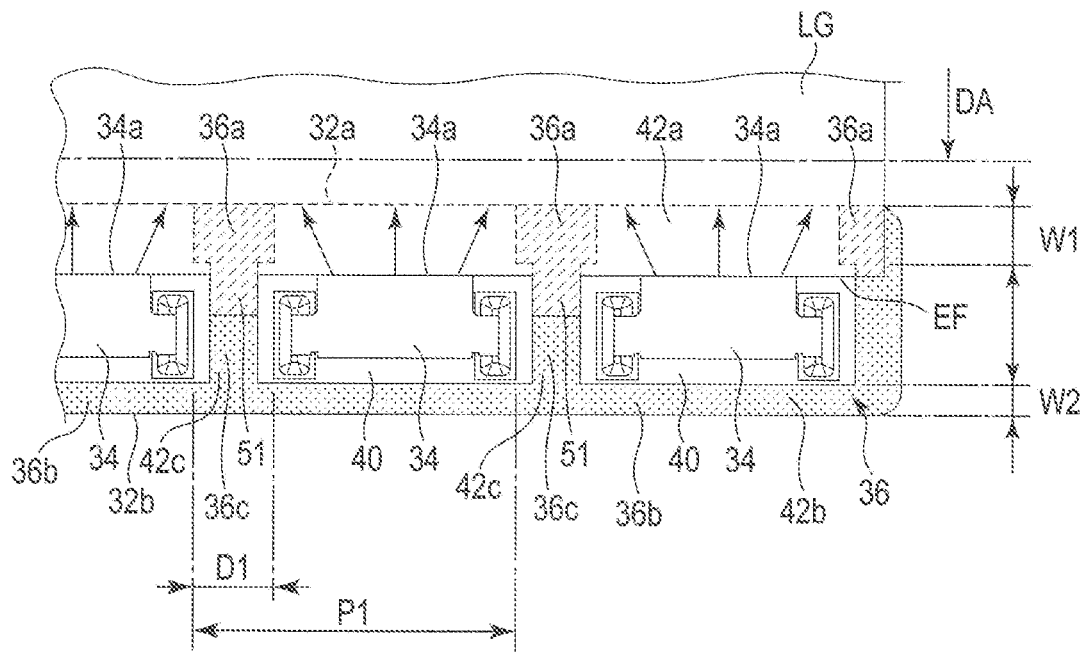
FIG. 7 is a plan view of the light source unit of the backlight device as viewed from a light guide plate side.

Next, the light source unit (light source device) 30 of the backlight unit 20 will be described in detail. FIG. 5 is a perspective view showing an LED mounting side of the light source unit. FIG. 6 is an exploded perspective view of the light source unit. FIG. 7 is a plan view of the light source unit as viewed from a light guide side.

As shown in FIGS. 5 and 6, the light source unit 30 comprises a belt-shaped flexible printed circuit substrate (FPC) 32 which functions as a wiring board, a plurality of light sources mounted on the FPC 32 and a heat-reactive adhesive sheet (low-temperature heat active adhesive film) 36 attached on the mount surface side of the FPC 32.

The FPC 32 includes a plurality of wirings (not shown) and a plurality of connection terminals 41 provided in mount regions, which will be described later. The FPC 32 includes a pair of long sides 32a and 32b extending parallel to each other. The FPC 32 includes a connection end portion 32c extending out from one long side 32b. The FPC 32 includes mount regions 40, a first adhesion region 42a and a second adhesion region 42b, which are set on one surface of the FPC 32. The mounting regions 40 are arranged between the pair of long sides 32a and 32b along these long sides. A pair of connection terminals 41 are exposedly provided in each mount region 40.

The first adhesion region 42a is defined between the long side 32a and the mount regions 40 and extends over the entire length of the long side 32a. The second adhesion region 42b is defined between the long side 32b and the respective mount region 40 and extends over the entire length of the long side 32b. In other words, the second adhesion region 42b is located on the opposite side to the first adhesion region 42a across the mount regions 40. In this embodiment, the FPC 32 further comprises a plurality of third adhesion regions 42c each extending from the first adhesion region 42a to the second adhesion region 42b through between each respective adjacent pair of mount regions 40. A width W1 of the first adhesion region 42a is less than, for example, a length of the LEDs in its depth direction (that is, the distance between the emission surface and the rear surface), which will be described later and a width W2 of the second adhesion region 42b is less than the width W1 of the first adhesion region 42a.

According to this embodiment, the light source used here has a structure that a plurality of light-emitting diodes (LEDs) 34, which are point light sources, are arranged with predetermined intervals. Each of the LED 34 comprises an emission surface 34a, a rear surface (side surface) located on an opposite side to the emission surface 34a, and a mount surface 34b perpendicular to the emission surface 34a and the rear surface. A frame portion of a predetermined width is provided around the emission surface 34a. The plurality of LEDs 34 are mounted respectively on the mount regions 40 of the FPC 32 and arranged in a longitudinal direction of the FPC 32 (a direction parallel to the long sides 32a and 32b, or a direction parallel to the short side portion 16d of the frame 16) at predetermined intervals therebetween. Each LED 34 is mounted while the mount surface 34b thereof opposes the FPC 32 and is electrically connected to a pair of connection terminals 41. The emission surfaces 34a of the LEDs 34 are arranged along the long side 32a. Here, an arrangement pitch of the LED 34 is defined as P1 and a gap between each adjacent pair of LEDs 34 is defined as D1.

For example, the heat reactive adhesive sheet 36 is formed of polyurethane or the like, and is a substrateless adhesive sheet having a thickness of about 50 μm. When heated to about 70 to 120° C., the adhesive sheet 36 exhibits adhesive strength as reacting to the object to be adhered. The heat reactive adhesive sheet 36 can exhibit about 3 to 5 times the adhesive strength of an ordinary double-sided tape.

As shown in FIGS. 5, 6 and 7, in this embodiment, the adhesive sheet 36 is formed substantially into a comb tooth shape. The adhesive sheet 36 includes a plurality of first regions 36a each adhered to the first adhesion region 42a of the FPC 32, a second region 36b adhered to the second adhesion region 42b of the FPC 32, and a plurality of third regions 36c adhered to the respective third adhesion regions 42c of the FPC 32.

The first regions 36a are arranged along the long side 32a of the FPC 32 at predetermined intervals in the first adhesion region 42a. Each first region 36a is arranged at a position opposing the gap between each respective adjacent pair of LEDs 34. For example, the first regions 36a have a rectangular shape, a width and a length of which are substantially equal to the width W1 of the first adhesion region 42a. The belt-shaped second region 36b has a width substantially equal to the width W2 of the second adhesion region 42b and is adhered over the entire length of the second adhesion region 42b. The plurality of third regions 36c are adhered respectively to the third adhesion regions 42c.

As shown in FIG. 4, in the first, second and third adhesion regions 42a, 42b and 42c of the FPC 32, an underlayer 50 may be provided on the surface of the FPC 32. The underlayer 50 is formed of a material having a high affinity to the adhesive sheet 36, i.e., a material to which the adhesive sheet 36 can easily adhere. As the underlayer 50, for example, white ink printing, black ink printing or a resist layer can be used. By adhering the adhesive sheet 36 onto the underlayer 50, the adhesion strength of the adhesive sheet 36 to the FPC 32 can be further improved.

As shown in FIG. 4, the thickness of the adhesive sheet 36 is the same as or less than the width of the frame portion of the emission surface 34a of the LED 34. With this configuration, the light emitted from the emission surface 34a directly enters the light guide LG, and thus the leaking of light between these can be suppressed as much as possible.

As shown in FIGS. 3, 4 and 7, the light source unit 30 is arranged along with the short side portion 16d of the frame 16 within the case 23. The first adhesion region 42a of the FPC 32 opposes the first main surface S1 of the light guide LG, and is adhered to the light guide LG by the first regions 36a of the adhesive sheet 36. The second adhesion region 42b of the FPC 32 is located on the stepped portion 16f of the short side portion 16d, and is adhered to the stepped portion 16f by the second region 36b of the adhesive sheet 36. Thus, the FPC 32 is fixed to the light guide LG and the frame 16.

A plurality of LEDs 34 are arranged between the short side portion 16d of the frame 16 and the incidence surface EF of the light guide LG. The emission surface 34a of each LED 34 opposes the incidence surface EF. In this embodiment, the emission surface 34a is located close to or in contact with the incidence surface EF. Further, the LEDs 34 are arranged in the recesses 19 of the short side portion 16d.

As shown in FIG. 7, according to this embodiment, the light guide LG comprises a plurality of projecting portions 51 integrated with the incidence surface EF. The projecting portions 51 each project out in a gap between a respective adjacent pair of LEDs 34 to be fit into the gap. In this case, the third regions 36c of the adhesive sheet 36 are adhered to the upper surfaces (which are continuous to the first main surface S1) of the respective projecting portions 51. Thus, the adhesion area between the adhesive sheet 36 and the light guide LG can be expanded. Note that a slight gap may exist between the projecting portions 51 and the respective LEDs 34.

An example of the process of attaching the light source unit 30 will be provided.

While heated at 60 to 80° C., the adhesive sheet 36 is temporarily fixed (temporarily pressure-fixed) to the FPC 32. Then, while heated at 60 to 80° C., the adhesive sheet 36 is temporarily fixed (temporarily pressure-fixed) to the light guide LG. After reconfirming the positions of the LEDs 34 and the light guide LG, including the adjustment of the positions, the adhesive sheet 36 is heated to 80 to 120° C., and pressure-fixed completely to the FPC 32, the frame 16 and the light guide LG.

As shown in FIGS. 2 and 3, the backlight unit 20 comprises a double-sided tape TP1. The double-sided tape TP1 is formed in a frame shape and is attached to the upper surface (the first surface SF1) of the frame 16. The double-sided tape TP1 is also attached to the peripheral portion of the second optical sheet OS2 placed on the stepped portion 16f. The backlight unit 20 is attached to the first substrate SUB1 by the double-sided tape TP1.

The FPC 32 of the light source unit 30 is connected to the FPC 22 via the connection end portion 32c (see FIGS. 1 and 2). A drive current is allowed to flow to the LEDs 34 via the FPC 22 and the FPC 32. The light emitted from the LEDs 34 enters the light guide LG from the incidence surface EF, propagates within the light guide LG or is reflected by the reflective sheet RE, and is emitted towards the liquid crystal panel 12 from the first main surface (emission surface) S1.

According to the backlight unit 20 and the liquid crystal display device 10 configured as described above in this embodiment, the heat reactive adhesive sheet 36 can exhibits about 3 to 5 times of adhesive strength as compared to that of ordinary double-sided tape; therefore even if the first and second adhesion regions 42a and 42b of the FPC (wiring board) 32 of the light source unit 30 are made smaller, the FPC 32 can be attached to the light guide LG and the frame 16 with sufficient adhesion strength. Thereby, the widths of the first and second adhesion regions 42a and 42b of the FPC 32 can be significantly decreased, and the light source unit 30 is downsized. As a result, the light source unit 30 can be disposed closer to the display area DA of the liquid crystal panel 12, and more specifically, the frame width on the light source side of the liquid crystal display device 10 can be reduced to about a half of the conventional case. Moreover, even if widths of the first adhesion region 42a and the second adhesion region 42b of the FPC 32 are decreased, that is, the adhesion area is reduced, the light source unit 30 can be firmly attached and fixed to the light guide LG and/or the frame 16 by using the high heat reactive adhesive sheet 36 having high adhesive strength.

Evaluation in peel strength was carried out to find out how much adhesion strength can be improved when the light source unit 30 and the light guide LG was adhered and fixed via the heat reactive adhesive sheet 36. The results indicated that the light guide LG is only cracked, but the adhered portion of the wiring board of the light source unit and the light guide did not peel off. The results of the peel strength evaluation also suggest that, by applying the heat reactive adhesive sheet, the light source unit 30 and the light guide LG can be fixed firmly even by a reduced adhesion area and therefore downsizing in the dimensions of the frame on the light source side can be realized.

As described above, according to this embodiment, the light source unit, the backlight device and the liquid crystal display device with narrowed frames on the light source side, which is unachievable by a structure using the conventional double-sided tape or adhesive tape, can be provided. Simultaneously, the problems arising from insufficient adhesive strength is, such as the occurrence of non-uniformity in luminance in LEDs, caused by peeling off of the adhesive sheet and peeling off of the light guide in the drop test can be solved as well. Furthermore, the heat reactive adhesive sheet has such features that when back to normal temperature after heat-adhesion, it maintains the adhesive strength to the object to adhere, but the portions not in contact with the object loses the adhesive strength. Therefore, dirt, dust and the like do not attach to the adhesive sheet, thereby suppressing the scattering of the light caused by dirt, dust and the like.

Next, liquid crystal display devices and backlight devices according to modifications and other embodiments will be described. In the modifications and other embodiments provided below, the same referential marks are given to the same parts as those of the first embodiment, the same portions as those of the first embodiment will be denoted by the same reference numbers and detailed description thereof will be omitted or simplified, and different portions from those of the first embodiment will be mainly described in detail.

(First Modification)

Figure 8:
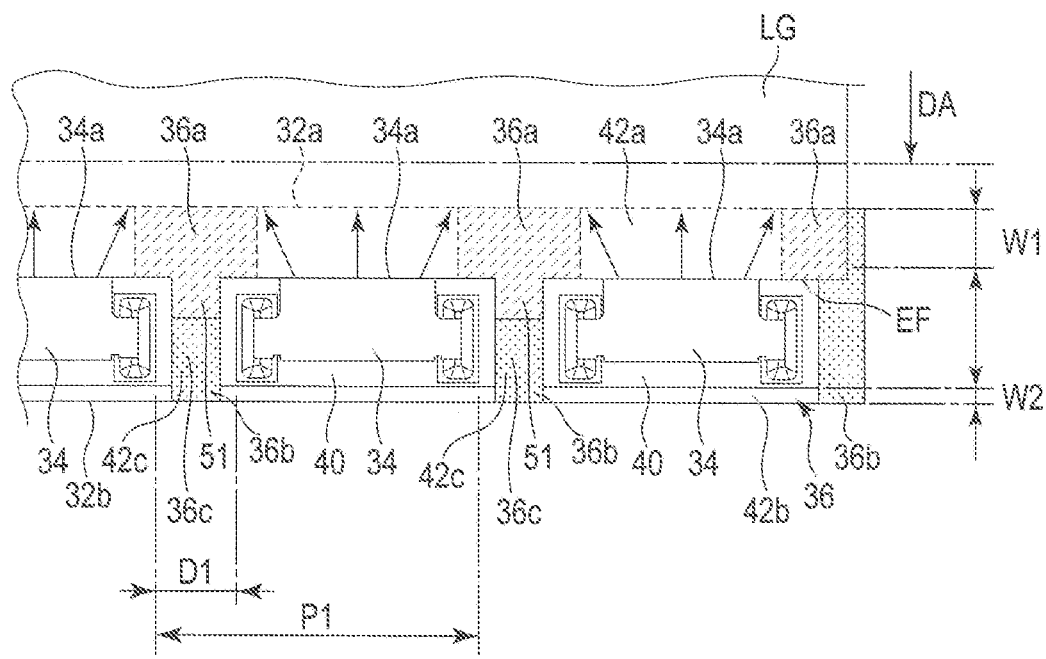
FIG. 8 is a plan view of a light source unit according to a first modification, as viewed from the light guide plate side.

FIG. 8 is a plan view of a light source unit according to a first modification as viewed from a light guide side. According to the first modification, the adhesive sheet 36 comprises a plurality of first regions 36a each attached to the first adhesion region 42a of the FPC 32, a plurality of third regions 36c attached to the third adhesion regions 42c of the FPC 32, and a plurality of second regions 36b each attached to the second adhesion region 42b of the FPC 32. The width W2 of the second adhesion region 42b of the FPC 32 is a half or less of the width of the second adhesion region 42b in the embodiment described above.

In the first adhesion region 42a, the first regions 36a are arranged along the long side 32a of the FPC 32 at predetermined intervals. Each of the first regions 36a is arranged in a position opposing the gap between a respective adjacent pair of LEDs 34. For example, the first region 36a is formed into a rectangular shape with a width substantially equal to the width W1 of the first adhesion region 42a. The length (along the long side 32a) of each first region 36a is set greater than the width W1. The third regions 36c and second regions 36b each extend from the first region 36a to the long side 32b of the FPC 32 and are adhered to the third adhesion regions 42c and the second adhesion region 42b. With this configuration, the first region 36a, the third regions 36c and the second regions 36b of the adhesive sheet 36 are formed into substantially T letter shapes.

In the first modification, the rest of the structure of the light source unit 30 is the same as that of the light source unit according to the first embodiment described above.

(Second Modification)

FIG. 9 is a plan view of a light source unit according to a second modification as viewed from a light guide side. According to the second modification, the adhesive sheet 36 includes a plurality of first regions 36a attached respectively to the first adhesion regions 42a of the FPC 32, a plurality of third regions 36c attached to the third adhesion region 42c, and a plurality of second regions 36b attached to the second adhesion region 42b. In the first adhesion region 42a, the first regions 36a are arranged at predetermined intervals along the long side 32a of the FPC 32. Each of the first regions 36a is disposed in a gap between each respective adjacent pair of LEDs 34. The first, third and second regions 36a, 36c and 36b are formed continuously into a rectangular shape which extend to pass the third adhesion regions 36c between adjacent pairs of LEDs 34 from the first adhesion regions 42a over to the second adhesion region 42b.

In the second modification, the rest of the structure of the light source unit 30 is identical to that of the light source unit according to the first modification described above. In the second modification, a flat plane of incidence without projecting portions is adopted for the incidence surface EF of the light guide LG.

(Third Modification)

FIG. 10 is a plan view of a light source unit according to a third modification as viewed from a light guide side. According to the third modification, the first region 36a of the adhesive sheet 36 is formed into a continuous belt shape, and is attached to over the entire length of the first adhesion region 42a of the FPC 32. With this configuration, the first region 36a extends over positions opposing the emission surfaces 34a of the LEDs 34 and also over positions opposing the gaps between respective adjacent pairs of the LEDs 34, (positions opposing the projecting portions). The width of the first region 36a is substantially equally to the width W1 of the first adhesion region 42a. A plurality of third regions 36c and second regions 36b each extend from the first region 36a to the long side 32b of the FPC 32, and are adhered to the third adhesion regions 42c and the second adhesion region 42b. Thus, the first region 36a and the third regions 36c of the adhesive sheet 36 are formed into a comb tooth shape reverse to that of the adhesive sheet of the first embodiment described above.

In the third modification, the rest of the structure of the light source unit 30 is identical to that of the light source unit of the first modification described above.

(Fourth Modification)

Figure 11:
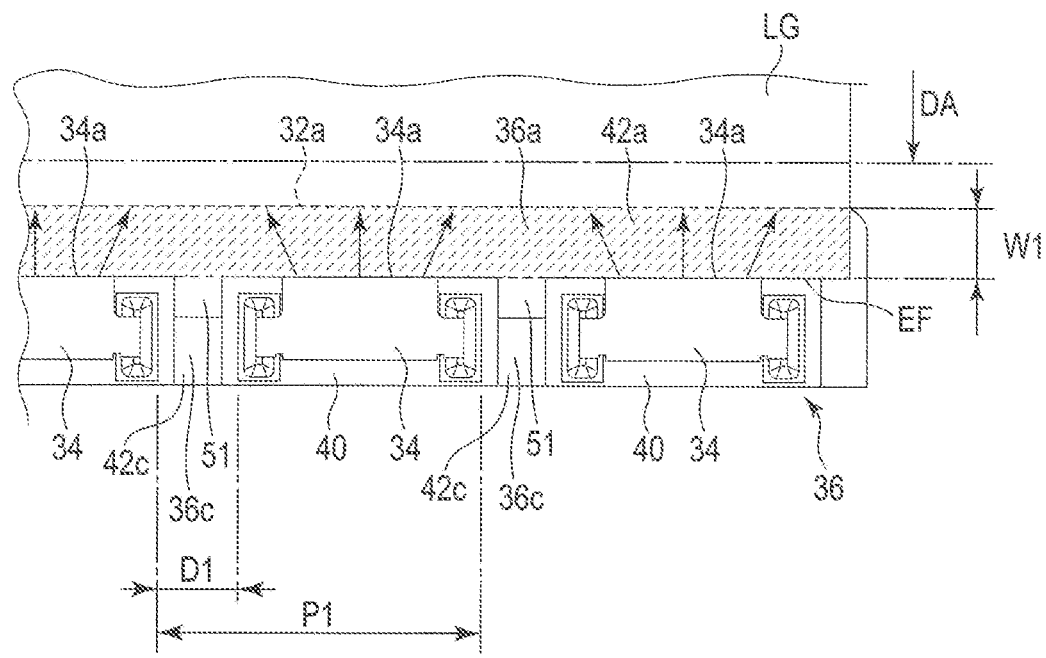
FIG. 11 is a plan view of a light source unit according to a fourth modification, as viewed from the light guide plate side.

FIG. 11 is a plan view of a light source unit according to a fourth modification as viewed from a light guide side. According to the fourth modification, the adhesive sheet 36 comprises a first region 36a, without a second region or third region. The first region 36a is formed into a continuous belt shape, and is adhered to over the entire length of the first adhesion region 42a of the FPC 32. With this configuration, the first region 36a extends over positions opposing the emission surfaces 34a of the LEDs 34 and also over positions opposing the gaps between respective adjacent pairs of the LEDs 34. Further, the FPC 32 is formed without a second adhesion region, so as to have a less width. More specifically, the FPC 32 is formed to have a width substantially equal to a total of the width W1 of the first adhesion region 42a and the width (a dimension in the depth direction) of the LED 34.

In the fourth modification, the rest of the structure of the light source unit 30 is identical to that of the light source unit of the first modification described above.

In the light source units and backlight devices according to the first to fourth modifications as well, the frame on the light source side can be further narrowed. Here, the adhesion area of the adhesive sheet is reduced; however with use of the heat reactive adhesive sheet 36, high adhesive strength can be maintained, thereby making it possible to prevent the peeling of the FPC 32 and the light guide LG off from each other.

Moreover, in the first embodiment, and the first, third and fourth modifications, a flat plane of incidence without projecting portions may be adopted for the incidence surface EF of the light guide LG.

(Fifth Modification)

Figure 12:
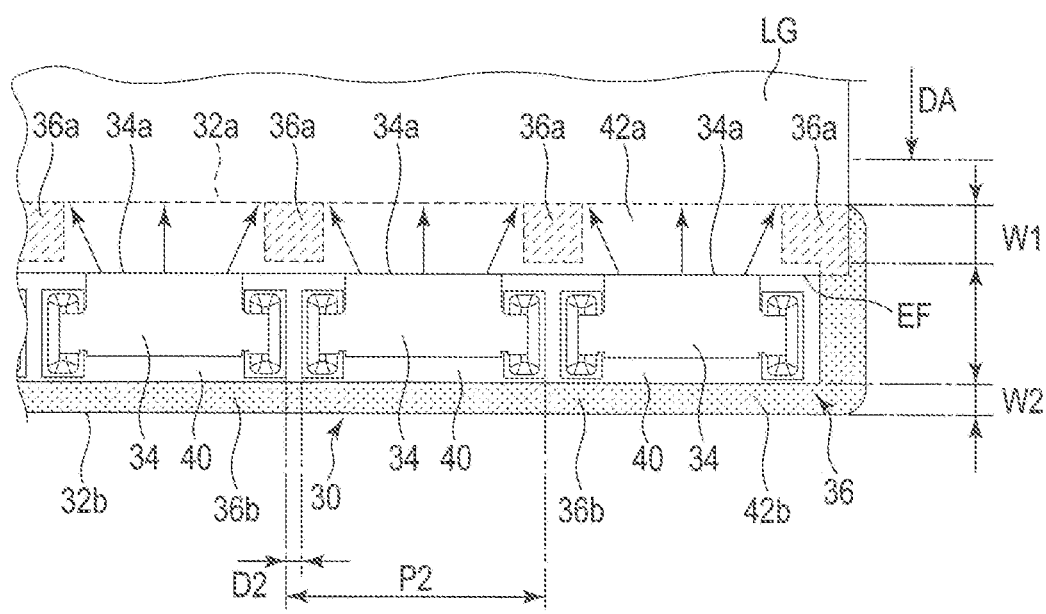
FIG. 12 is a plan view of a light source unit according to a fifth modification, as viewed from the light guide plate side.

FIG. 12 is a plan view of a light source unit according to a fifth modification as viewed from a light guide side. According to the fifth modification, an arrangement pitch P2 of the LEDs 34 as a light source and a gap D2 between respective adjacent pairs of LEDs 34 are set less than the arrangement pitch P1 and the gap D1, respectively in the first embodiment (P2<P1, D2<D2). With this configuration, the number of installations of LEDs 34 is increased. Further, by reducing the gap between the incidence surface EF of the light guide LG and the display area DA, the light source unit 30 can be placed closer to the display area DA.

Since the gap D2 between adjacent LEDs 34 is narrowed, the third adhesion region of the FPC (wiring board) 32 and the third region of the heat reactive adhesive sheet 36 are omitted. The first regions 36a of the adhesive sheet 36 are each formed into an independent island shape, and arranged along the longitudinal direction of the first adhesion region 42a (along the long side 32a). In the fifth modification, the rest of the structure of the light source unit 30 is identical to that of the light source unit according to the first embodiment described above.

According to the light source unit and backlight device of the fifth modification, the frame on the light source side can be further narrowed. Moreover, although the adhesion area of the adhesive sheet is reduced; however with use of the heat reactive adhesive sheet 36, high adhesive strength can be maintained, thereby making it possible to prevent the peeling of the FPC 32 and the light guide LG off from each other.

(Sixth Modification)

Figure 13:
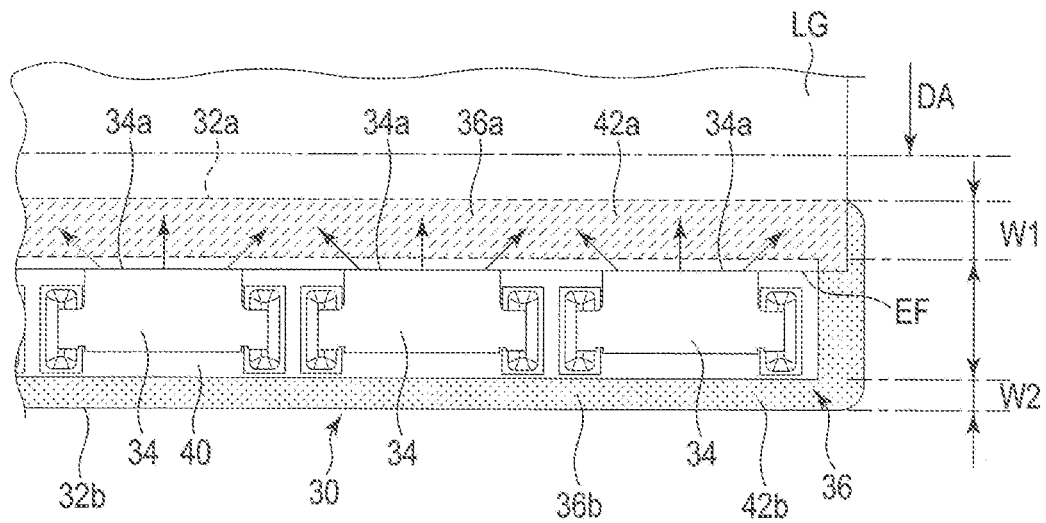
FIG. 13 is a plan view of a light source unit according to a sixth modification, as viewed from the light guide plate side.

FIG. 13 is a plan view of a light source unit according to a sixth modification as viewed from a light guide side. According to the sixth modification, the first region 36a of the heat reactive adhesive sheet 36 is formed into a continuous belt shape and adhered to over the entire length of the first adhesion region 42a of the FPC 32. With this configuration, the first region 36a extends over positions opposing the emission surfaces 34a of the LEDs 34 and also over positions opposing the gaps between respective adjacent pairs of the LEDs 34. In the sixth modification, the rest of the structure of the light source unit 30 is identical to that of the light source unit according to the fifth modification described above.

According to the sixth modification, the adhesion area of the adhesive sheet 36 can be increased. Moreover, in combination with the increase in the adhesion area, the first region 36a of the adhesive sheet 36 is firmly adhered to the FPC 32 and the light guide LG, and cannot be easily detached. For this reason, even in the case where it is provided on an emission surface 34a side of the LEDs 34, a factor causing non-uniformity in luminance cannot be created. Moreover, the adhesive sheet 36 is present between the emission surfaces of the LED 34 and the light guide LG located above. With this configuration, even if light from an emission surface leaks from the light guide LG to the above, the light eventually enter the adhesive sheet 36, thereby suppressing the leakage of light around the light source as compared to the case without the adhesive sheet 36.

(Second Embodiment)

Figure 14:
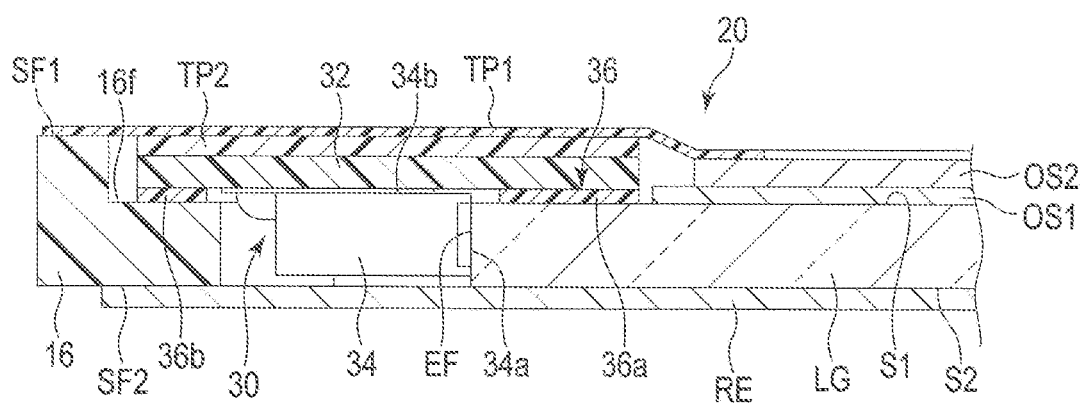
FIG. 14 is a cross sectional view showing a light source-side portion of a backlight device of a liquid crystal display according to a second embodiment.

FIG. 14 is a cross sectional view showing a backlight device according to a second embodiment as viewed from a light source side. According to the second embodiment, a case of a backlight unit 20 comprises a frame 16 without a metal-made bottom plate. In place, a reflective sheet RE is fixed to a second surface SF2 of the frame 16, to form the bottom plate. That is, for example, a peripheral portion of the reflective sheet RE is attached to the second surface SF2 of the frame 16 with a double-sided tape and thus the reflective sheet RE covers a lower surface side of the frame 16. A light guide LG is disposed on the reflective sheet RE within the frame 16, and further, a first optical sheet OS1 and a second optical sheet OS2 are stacked on the light guide LG in this order. The structure of the light source unit 30 and the attachment structure thereof to the frame 16 and the light guide LG and is the same as that of the first embodiment described above.

According to the second embodiment having the above-described structure, the bottom plate of the case can be omitted, thereby making it possible to simplify the structure, slim down the backlight device, and narrow the frame. In addition, also in the second embodiment, the same advantages as those of the above-described first embodiment can be obtained.

(Third Embodiment)

FIG. 15 is a cross sectional view showing a light source side of a backlight device according to a third embodiment. According to the third embodiment, a case (bezel) 23 of a backlight unit 20 is formed without a resin frame, but only from a metal plate. That is, the case 23 comprises a rectangular bottom plate 17a and a plurality of side plates 17b built to stand along a periphery of the bottom plate 17a, integrated as one body by bending the metal plate. At least the side plate 17b on the light source side is bent in three steps to include a stepped portion 17c and a flange 17d at an upper end. The FPC 32 of the light source unit 30 is adhered to a first main surface S1 of the light guide LG and the stepped portion 17c of the side plate 17b via a first region 36a and a second region 36b of a heat reactive adhesive sheet 36. Further, a double-sided tape TP1 is attached on the flange 17d of the case 23 and further to the FPC 32 of the light source unit 30 via a spacer tape TP2.

According to the third embodiment, the case 23 of the above-described structure is used, and thus the number of parts of the backlight device is reduced, thereby making it possible to further narrow the frame. Note that the case 23 may be formed not only from a metal plate, but also by molding a resin such as polycarbonate, and the heat reactive adhesive sheet 36 can be effectively adhered to a metal as well as resin. Moreover, when a nonmetallic case, which is nonmagnetic, is used, it is possible to improve the antenna sensitivity and touch-panel sensitivity and also to reduce the weight.

(Fourth Embodiment)

FIG. 16 is a cross sectional view showing a light source side of a backlight device according to a fourth embodiment. According to the fourth embodiment, an FPC 32 of a light source unit 30 is disposed on a second main surface (lower surface) S2 side of the light guide LG and a second surface (lower surface) SF2 side of the frame 16. That is, a first adhesion region 42a of the FPC 32 is attached to an incidence surface side end of the second main surface S2 by a first region 36a of a heat reactive adhesive sheet 36. A second adhesion region 42b of FPC 32 is attached to the second surface SF2 of the frame 16 by a second region 36b of the adhesive sheet 36. Further, a rear surface (on an opposite side to the surface on which LEDs 34 are mounted) of the FPC 32 is attached to a bottom plate 17 by a double-sided tape TP2, for example. A plurality of LEDs 34 on the FPC 32 are arranged in such a state where emission surfaces 34a thereof oppose or are in contact with an incidence surface EF of the light guide LG. Thus, the light source unit 30 can be installed upside down with respect to the case of the first embodiment. A double-sided tape TP1 is attached on a first surface SF1 of the frame 16 and further to peripheral portions of optical sheets OS1 and OS2 via a spacer 47.

FIG. 17 is a cross sectional view showing a light source side of a liquid crystal display device employing the above-described backlight device. The backlight unit 20 is attached to a first substrate SUB1 of the liquid crystal display panel 12 with the double-sided tape TP1, so as to oppose the liquid crystal display panel 12. The structures of the display panel 12 and the cover panel 14 are the same as those of the liquid crystal display panel and cover panel of the first embodiment.

The fourth embodiment configured as described above can also achieve the same advantage as that of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Based on the structures which have been described in the above-described embodiment and variations, a person having ordinary skill in the art may achieve structures with arbitral design changes; however, as long as they fall within the scope and spirit of the present invention, such structures are encompassed by the scope of the present invention. For example, the outer shape and inner shape of the structural members of the liquid crystal panel and the backlight unit and those of the frame are not limited to rectangular, but one or both of the outer shape and inner shape may be in some other shape, for example, polygonal, circular, elliptical or a combination of any of these. The shapes of the liquid crystal panel and the backlight unit are not limited to flat, but they may be partially or entirely curved or inclined. The materials of the structural members of the liquid crystal panel and the backlight unit are not limited to those of the examples provided above, but may be selected from various options.

Furthermore, regarding the present embodiments, any advantage and effect those will be obvious from the description of the specification or arbitrarily conceived by a skilled person are naturally considered achievable by the present invention.

What is claimed is:

1. A light source device comprising:
a wiring substrate including a plurality of mount regions in a longitudinal direction of the wiring substrate, a first adhesion region extending between a first edge of the wiring substrate and the mount regions, and a second adhesion region;
a plurality of light sources mounted on the mount regions of the wiring substrate and arranged in the longitudinal direction with a gap between two adjacent light sources;
a plurality of first heat reactive adhesive sheets adhered to the wiring substrate; and
a second heat reactive adhesive sheet adhered to the second adhesion region, wherein
each of the first heat reactive adhesive sheets has an independent island shape having a width in the longitudinal direction larger than the gap and is provided on the first adhesion region of the wiring substrate,
each of the first heat reactive adhesive sheets is provided in positions opposing the gap between each adjacent pair of light sources,
the second adhesion region extends on an opposite side to the first adhesion region with interposing the light sources therebetween, and
the second heat reactive adhesive sheet is belt-shaped and entirely covers three edges of the wiring substrate in a plan view.

2. The light source device of claim 1, wherein the first heat reactive adhesive sheet is substrateless.

3. A backlight device comprising:
a light guide comprising an emission surface and an incidence surface crossing the emission surface; and
a light source device configured to emit light entering the incidence surface, the light source device comprising:
a wiring substrate including a plurality of mount regions in a longitudinal direction of the wiring substrate, a first adhesion region extending between a first edge of the wiring substrate and the mount regions, and a second adhesion region,
a plurality of light sources mounted respectively on the plurality of mount regions and arranged in the longitudinal direction with a gap between two adjacent light sources,
a plurality of first heat reactive adhesive sheets adhered to the wiring substrate and the light guide, and
a second heat reactive adhesive sheet adhered to the second adhesion region, wherein
each of the first heat reactive adhesive sheets has an independent island shape having a width in the longitudinal direction larger than the gap and is provided on the first adhesion region of the wiring substrate,
each of the first heat reactive adhesive sheets is provided in positions opposing the gap between each adjacent pair of light sources,
the second adhesion region extends on an opposite side to the first adhesion region with interposing the light sources therebetween, and
the second heat reactive adhesive sheet is belt-shaped and entirely covers three edges of the wiring substrate in a plan view.

4. The backlight device of claim 3, further comprising:
a case including a frame,
wherein
the light guide and the light source device are disposed in the case, and
the second adhesion region of the wiring substrate is adhered to the frame by the second heat adhesive sheet.

5. The backlight device of claim 3, wherein the first heat reactive adhesive sheet is substrateless.

6. The backlight device of claim 3, wherein the first heat reactive adhesive sheets are adhered to the first adhesion region and the light guide by being heated while the first heat reactive adhesive sheets are contacted to the first adhesion region and the light guide.

7. A liquid crystal display device comprising:
a liquid crystal panel; and
a backlight device provided to oppose the liquid crystal panel;
the backlight device comprising:
a light guide comprising an emission surface and an incidence surface crossing the emission surface; and
a light source device configured to emit light entering the incidence surface, the light source device comprising:
a wiring substrate including a plurality of mount regions in a longitudinal direction of the wiring substrate, a first adhesion region extending between a first edge of the wiring substrate and the mount regions, and a second adhesion region,
a plurality of light sources mounted respectively on the plurality of mount regions and arranged in the longitudinal direction with a gap between two adjacent light sources,
a plurality of first heat reactive adhesive sheets adhered to the wiring substrate and the light guide, and
a second heat reactive adhesive sheet adhered to the second adhesion region, wherein
each of the first heat reactive adhesive sheets has an independent island shape having a width in the longitudinal direction larger than the gap and is provided on the first adhesion region of the wiring substrate,
each of the first heat reactive adhesive sheets is provided in positions opposing the gap between each adjacent pair of light sources,
the second adhesion region extends on an opposite side to the first adhesion region with interposing the light sources therebetween, and
the second heat reactive adhesive sheet is belt-shaped and entirely covers three edges of the wiring substrate in a plan view.

8. The liquid crystal display device of claim 7, wherein the first heat reactive adhesive sheet is substrateless.

9. The liquid crystal display device of claim 7, wherein the first heat reactive adhesive sheets are adhered to the first adhesion region and the light guide by being heated while the first heat reactive adhesive sheets are contacted to the first adhesion region and the light guide.

* * * * *